(12) United States Patent
Schultz et al.

(10) Patent No.: US 11,558,018 B2
(45) Date of Patent: Jan. 17, 2023

(54) INTEGRATED CIRCUITS CONTAINING VERTICALLY-INTEGRATED CAPACITOR-AVALANCHE DIODE STRUCTURES

(71) Applicant: NXP USA, Inc., Austin, TX (US)

(72) Inventors: Joseph Gerard Schultz, Wheaton, IL (US); Kevin Kim, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 428 days.

(21) Appl. No.: 16/775,573

(22) Filed: Jan. 29, 2020

(65) Prior Publication Data
US 2021/0234516 A1    Jul. 29, 2021

(51) Int. Cl.
*H03F 1/52*     (2006.01)
*H01L 23/522*   (2006.01)
(Continued)

(52) U.S. Cl.
CPC ........... *H03F 1/523* (2013.01); *H01L 23/528* (2013.01); *H01L 23/5223* (2013.01);
(Continued)

(58) Field of Classification Search
CPC ......... H03F 1/523; H03F 1/02; H03F 1/0288; H03F 3/213; H03F 2200/426;
(Continued)

(56) References Cited

U.S. PATENT DOCUMENTS

| 4,405,933 A | 9/1983 | Avery |
| 6,930,906 B2 * | 8/2005 | Matsushita ............ G11C 11/22 365/174 |

(Continued)

FOREIGN PATENT DOCUMENTS

| GB | 2365217 A | 2/2002 |
| JP | H01-264250 A | 10/1989 |

OTHER PUBLICATIONS

Lin et al., Investigation of ESD Performance in Silicon Integrated Passive Devices, 2008 10th Electronics Packaging Technology Conference, IEEE 2008 (6 pages).

*Primary Examiner* — Tu-Tu V Ho (57) ABSTRACT

Integrated circuits, such as power amplifier integrated circuits, are disclosed containing compact-footprint, vertically-integrated capacitor-avalanche diode (AD) structures. In embodiments, the integrated circuit includes a semiconductor substrate, a metal layer system, and a vertically-integrated capacitor-AD structure. The metal layer system includes, in turn, a body of dielectric material in which a plurality of patterned metal layers are located. The vertically-integrated capacitor-AD structure includes a first AD formed, at least in part, by patterned portions of the first patterned metal layer. A first metal-insulator-metal (MIM) capacitor is also formed in the metal layer system and at least partially overlaps with the first AD, as taken along a vertical axis orthogonal to the principal surface of the semiconductor substrate. In certain instances, at least a majority, if not the entirety of the first AD vertically overlaps with the first MIM capacitor, by surface area, as taken along the vertical axis.

19 Claims, 9 Drawing Sheets

(51) Int. Cl.
   *H01L 23/528* (2006.01)
   *H01L 27/02* (2006.01)
   *H01L 49/02* (2006.01)
   *H01L 29/78* (2006.01)
   *H03F 1/02* (2006.01)
   *H03F 3/213* (2006.01)

(52) U.S. Cl.
   CPC ...... *H01L 23/5226* (2013.01); *H01L 27/0255* (2013.01); *H01L 28/60* (2013.01); *H01L 29/7816* (2013.01); *H03F 1/02* (2013.01); *H03F 1/0288* (2013.01); *H03F 3/213* (2013.01); *H03F 2200/426* (2013.01); *H03F 2200/444* (2013.01); *H03F 2200/451* (2013.01)

(58) Field of Classification Search
   CPC ......... H03F 2200/444; H03F 2200/451; H01L 23/5223; H01L 23/5226; H01L 23/528; H01L 27/0255; H01L 28/60; H01L 29/7816
   USPC ...................................................... 330/298
   See application file for complete search history.

(56) References Cited

U.S. PATENT DOCUMENTS

| | | |
|---|---|---|
| 8,222,698 B2 | 7/2012 | Salcedo et al. |
| 2003/0174532 A1* | 9/2003 | Matsushita ............. G11C 11/22 365/145 |
| 2007/0228475 A1 | 10/2007 | Burdeaux et al. |
| 2010/0214704 A1 | 8/2010 | Lamey et al. |
| 2011/0198725 A1* | 8/2011 | Roest ................... H01L 27/0251 257/532 |
| 2015/0311193 A1 | 10/2015 | Laine et al. |
| 2016/0351673 A1* | 12/2016 | Lai ................... H01L 21/823431 |
| 2017/0103976 A1 | 4/2017 | Zampardi et al. |

\* cited by examiner

INTEGRATED CIRCUITS CONTAINING VERTICALLY-INTEGRATED CAPACITOR-AVALANCHE DIODE STRUCTURES

TECHNICAL FIELD

Embodiments of the present disclosure relate generally to microelectronics and, more particularly, to power amplifier integrated circuits and other integrate circuits containing vertically-integrated capacitor-avalanche diode structures.

ABBREVIATIONS

Abbreviations appearing relatively infrequently in this document are defined upon initial usage, while abbreviations appearing more frequently in this document are defined below:
AD—avalanche diode;
APD—avalanche poly diode;
ESD—electrostatic discharge;
FET—field effect transistor;
IC—integrated circuit;
PAIC—power amplifier integrated circuit; and
RF—radio frequency.

BACKGROUND

PAICs commonly contain multiple ESD protection structures to protect FETs and other devices formed on a semiconductor die and vulnerable to over-voltage damage during an ESD event. By common design, ESD protection structures are realized as ADs formed in a metal layer system produced over a semiconductor substrate, such as APDs formed over a singulated piece of a bulk silicon wafer. Industry demands have urged the continued miniaturization of PAIC-bearing semiconductor dies (herein, "PAIC dies") due, in part, to the development of massive multi-input, multi-output (MIMO) systems and small cell, beam forming cellular technologies reliant upon increased spatial diversity of RF signals; e.g., to signal boost throughput for 5G cellular networks. As the planform dimensions (widths and lengths) of PAIC dies has decreased, while the number of ESD protection structures integrated into many PAIC die topologies has grown, the fraction of the available IC floor space exclusively devoted to accommodating ESD protection structures has also risen. Consequently, ESD protection structures have now become undesirably space-dominant in many current PAIC die topologies, particularly in the case of PAIC die topologies designed for small cell, lower power applications.

BRIEF DESCRIPTION OF THE DRAWINGS

At least one example of the present invention will hereinafter be described in conjunction with the following figures, wherein like numerals denote like elements.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Definitions

The following definitions apply throughout this document. Those terms not expressly defined here or elsewhere in this document are assigned their ordinary meaning in the relevant technical field.
Patterned metal layer—a single layer or multilayer body of material patterned to define electrically-conductive features, such as traces or interconnect lines, and predominately composed of at least one metal constituent by weight.
Metal layer system—a layered structure including multiple patterned metal layers (defined above) and dielectric layers formed over a substrate, such as the active surface of a transistor-bearing semiconductor die.
Metal-insulator-metal (MIM) capacitor—a capacitor integrally formed in a metal layer system (defined above) and including patterned metal regions defining at least two capacitor plates separated by at least one intervening dielectric layer.

Power Amplifier Integrated Circuit (PAIC) die—a semiconductor die on which at least one power amplifier transistor is fabricated, possibly in addition to a vertically-integrated capacitor-AD structure (examples of which are described below) and other integrated devices.

Vertically-overlapping—a term utilized to describe the spatial relationship between two structures or elements, such as a MIM capacitor and an AD, formed on substrate and at least partially overlapping along an axis orthogonal to a principal (e.g., upper or active) surface of the substrate.

Overview

As previously indicated, an ongoing industry demand exists for the development of PAICs and other integrated circuits amenable to size and cost reductions, while possessing ESD-protection capabilities comparable to, if not superior to conventional IC designs containing AD elements. In satisfaction of this industrial demand, the following disclosure describes integrated circuits, such as PAICs, containing unique, vertically-integrated capacitor-AD structures. The vertically-integrated capacitor-AD structures provide capacitance and ESD protection functions in a three dimensional space having a compact footprint Embodiments of the vertically-integrated capacitor-AD structure include at least one MIM capacitor and at least one AD element or device (herein referred to simply as an "AD") formed in a metal layer system, which is produced over a principal surface of a semiconductor substrate. The substrate surface over which the metal layer system is fabricated is further referred to herein as the "upper principal surface" of the semiconductor substrate, with the metal layers likewise referred to as "upper" or "lower" metal (or dielectric) layers formed "above" or "below" each other, as the case may be. Such terms of orientation are defined in a relative sense in view of proximity of the named layers (or other elements) to the upper principal surface of the semiconductor substrate. Such terms should thus not be considered limiting, noting that a given integrated circuit can function in any orientation in three dimensional space and may be attached to a larger system substrate (e.g., a printed circuit board) in an inverted or "flip chip" orientation in certain instances. Finally, as further appearing herein, the term "avalanche diode" and the corresponding abbreviation "AD" refers to a diode designed to breakdown and conduct current at a particular trigger (reverse bias) voltage due to the occurrence of the avalanche effect within the semiconductor material (e.g., polysilicon) of the diode.

Embodiments of the below-described integrated circuit or IC die include at least one transistor in addition to at least one vertically-integrated capacitor-AD structure. In embodiments in which the integrated circuit is a PAIC, the transistor may assume the form of power amplifier transistor(s), such as FETs, with the power amplifier transistor(s) and the vertically-integrated capacitor-AD structure(s) fabricated on a common semiconductor substrate or die body. The semiconductor substrate can be fabricated from any material or group of materials, providing that at least a portion of the substrate is composed of a semiconductor material and is suitable for IC fabrication. In embodiments, the semiconductor substrate may assume the form of a singulated piece of a bulk silicon (Si) wafer, in which case the below-described ADs may be specifically implemented as APDs contacting the upper principal surface of the Si IC die. In other embodiments, the semiconductor substrate may be composed of a different semiconductor material (examples of which are listed below) or may be layered structure containing, for example, a buried oxide layer. When the integrated circuit assumes the form of a PAIC incorporated into a Doherty power amplifier system, the power amplifier transistor can be, for example, a power amplifier FET that functions to amplify a peaking or carrier signal during system operation. In other instances, a different transistor technology can be employed and/or the PAIC may be integrated into a different type of power amplifier system, such as a push-pull type amplifier system.

Regardless of the particular type of system in which the integrated circuit is employed, size reduction of the integrated circuit is enabled through the incorporation of one or more vertically-integrated capacitor-AD structures into the integrated circuit. Within a given vertically-integrated capacitor-AD structure, at least one MIM capacitor and at least one AD are disposed in a vertically-overlapping relationship such that at least a portion of the MIM capacitor and at least a portion of the AD (if not the majority or substantial entirety of the MIM capacitor and the AD structure by planform surface area) overlap as taken along a vertical axis orthogonal to the upper principal surface of the semiconductor substrate. The AD (or ADs) included in a given vertically-integrated capacitor-AD structure, specifically, may be located at or coplanar with the interface of the upper principal surface of the substrate and include metal features formed in an initially-deposited or "M1" metal layer included in the metal layer system. While a given AD may be described as formed "in" the metal layer system herein, it will be appreciated that current conducted across the AD (when the breakdown voltage is surpassed during an ESD event) will pass through the regions of the semiconductor substrate located beneath and spanning the elongated conductive electrodes or "fingers" of the AD. Further, in embodiments, the MIM capacitor may be formed over the AD such that at least a majority of the surface area of the AD, if not the substantial entirety of the AD is located beneath by the MIM capacitor, when viewed along the vertical axis looking downwardly on the semiconductor substrate. Concurrently, sufficient vertical spacing is provided between the MIM capacitor (or capacitors) and the AD (or ADs) and filled, in whole or in part, with a dielectric material to allow substantially independent, unimpeded operation of both the MIM capacitor and AD. Upon occurrence of an ESD event, however, the AD is configured to rapidly reach breakdown voltage and allow current to flow between the input and output terminals of the vertically-integrated capacitor-AD structure, while bypassing the MIM capacitor to protect the MIM capacitor from potential over-voltage damage.

The space savings afforded by incorporation of one or more vertically-integrated capacitor-AD structures into a given PAIC or other integrated circuit can be exploited to reduce the overall footprint and, therefore, the overall cost of the integrated circuit or IC die as desired. Alternatively, such space savings can be leveraged to introduce additional circuit elements into the IC design and/or to grow the dimensions and capacity of existing circuit elements. Additionally, embodiments of the vertically-integrated capacitor-AD structure may provide benefits beyond permitting a more efficient usage of IC floor space. Performance benefits, such as reduced parasitic capacitances and reduced current leakage, may also be achieved by the vertically-integrated capacitor-AD structure in at least some embodiments for reasons explained below. Further, embodiments of the vertically-integrated capacitor-AD structure provide a high level of design flexibility, allowing the integration of varying combinations of MIM capacitors and ADs within a given vertically-integrated capacitor-AD structure, as well as varying combinations of interconnection schemes; e.g., in embodiments in which multiple ADs are integrated into a vertically-integrated capacitor-AD structure, interconnect features (e.g., traces and other conductive features within the metal layer system) may be formed to electrically connect the ADs in parallel across the terminals of the vertically-integrated capacitor-AD structures or, instead, to connect the ADs in series for increased breakdown voltage and reduced current leakage. As a still further benefit, embodiments of the vertically-integrated capacitor-AD structure can be integrated into existing manufacturing process flows and IC designs with minimal cost and modifications. A first example PAIC or PAIC die including a vertically-integrated capacitor AD structure will now be described in connection with FIGS. 1-6, with additional example vertically-integrated capacitor-AD structures further discussed below in connection with FIGS. 7-11. While described below in conjunction with a particular PAIC die having certain physical characteristics, it is emphasized that embodiments of the vertically-integrated capacitor AD structure can be incorporated into various different IC designs without limitation when, for example, a compact ESD protection-capacitor hybrid solution is beneficially applied.

Figure 1:
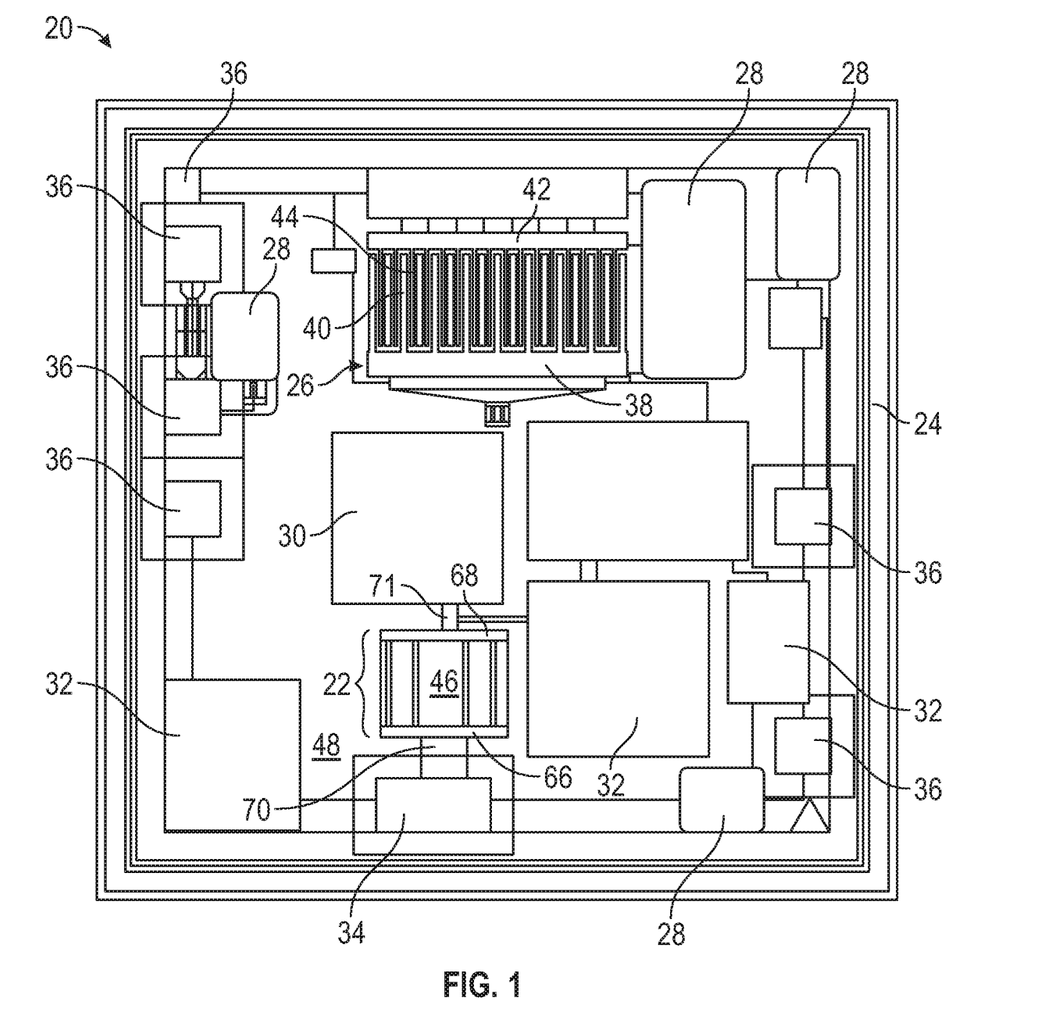
FIG. 1 is a simplified planform view of a PAIC die including a vertically-integrated capacitor-AD structure formed in a metal layer system overlying the active surface of a semiconductor substrate, such as a transistor-bearing IC die, as illustrated in accordance with an example embodiment of the present disclosure.

Example Power Amplifier Integrated Circuit Containing a Vertically-Integrated Capacitor-Avalanche Diode Structure FIG. 1 is a generalized planform or top-down view of a PAIC 20 containing at least one vertically-integrated capacitor-AD structure 22, as illustrated in accordance with an example embodiment. PAIC 20 (also referred to as "PAIC die 20") is fabricated on a semiconductor substrate or die body 24. As indicated above, semiconductor substrate 24 can be wholly composed of a semiconductor material, such a Si, in embodiments; or can be a layered structure, providing that substrate 24 is at least partially composed of a semiconductor material contacted by the AD (or ADs) included within vertically-integrated capacitor-AD structure 22, as described below. Various other components are fabricated on semiconductor substrate 24 including, most pertinently, a power amplifier FET 26 and several additional ESD protection structures 28. The particular circuit topology of PAIC 20 is generally inconsequential to embodiments of the present disclosure and will thus not be described in detail, aside from briefly noting that PAIC 20 may also include any number of additional circuit elements formed on semiconductor substrate 24 including inductive elements (e.g., spiral inductors 30, 32), capacitive elements, transmission lines, landing or bond pads (e.g., bond pads 34, 36), and other such circuit elements completing the desired power amplifier topology. Collectively such circuit elements may form or help form impedance matching network(s) on the input side and/or output side of power amplifier FET 26, noting that additional impedance matching is typically provided offboard PAIC 20; e.g., via additional circuitry mounted to a printed circuit board to which PAIC 20 (or a microelectronic package containing PAIC 20) may be attached. So too may PAIC 20 include circuitry supporting biasing of one or more terminal of power amplifier FET 26 in embodiments. In various implementations, PAIC 20 is included in a larger Doherty PA system or circuit, with FET 26 providing amplification of the carrier or peaking signal transmitted through the Doherty PA system.

As noted above, PAIC 20 includes a power amplifier transistor in the form of FET 26 in the illustrated example. In further embodiments, PAIC 20 can differ to varying extents and may potentially include multiple FETs collectively forming a multi-stage amplifier and/or can include a different type of transistor, such as one or more bipolar transistors. The manner in which FET 26 is implemented will also vary based on the composition of semiconductor substrate 24, with FET 26 potentially implemented utilizing any of the following: a silicon-based FET (e.g., a laterally-diffused metal oxide semiconductor FET or LDMOS FET) or a III-V FET (e.g., a gallium nitride (GaN) FET, a gallium arsenide (GaAs) FET, a gallium phosphide (GaP) FET, an indium phosphide (InP) FET, or an indium antimonide (InSb) FET, or another type of III-V transistor). Considering this, the following description of power amplifier FET 26 and, more broadly, of PAIC 20 should be understood as establishing a non-limiting example context in which embodiments of vertically-integrated capacitor-AD structure 22 can be better understood. This stated, in various implementations, power amplifier FET 26 may be produced as a silicon-based FET, such as a LDMOS FET, fabricated on bulk Si wafer subsequently singulated to yield semiconductor substrate 24. Power amplifier FET 26 includes a gate terminal formed with or otherwise connecting to a gate manifold 38, a plurality of elongated gate contact fingers 40 extending from gate manifold 38 (only one of which is labeled in FIG. 1), a drain terminal formed with or connecting to a drain manifold 42, and a plurality of elongated drain lines 44 extending from drain manifold 42 (again, only one of which is labeled). Such features of FET 26 may be defined by patterning of the below-described M1 layer in at least some implementations. Source and drain regions are created by doping selected regions of semiconductor substrate 24 during transistor fabrication; e.g., as seen looking downwardly onto upper principal surface 52, each source region may be located between or laterally bordered by two of drain lines 44 and two underlying drain regions, which are, in turn, located between or bordered by two of gate contact fingers 40. A comb-type or interdigitated transistor finger arrangement is thus provided in the illustrated example. Other transistor configurations are possible in further implementations.

Vertically-integrated capacitor-AD structure 22 is electrically coupled between a terminal (here, an RF input terminal 34) of PAIC 20 and an input terminal (herein, a gate control terminal 38) of power amplifier FET 26. As indicated above, vertically-integrated capacitor-AD structure 22 contains at least one AD, which protects at least one MIM capacitor 46 from damage should an ESD event occur. The AD is located at elevation beneath MIM capacitor 46 within a metal layer system formed over the upper surface of semiconductor substrate 24. Specifically, the AD may be located directly below and centered beneath MIM capacitor 46, as taken along an axis orthogonal to the upper principal surface of semiconductor substrate 24 on which power amplifier FET 26 and the other circuit elements are formed. The AD contained within vertically-integrated capacitor-AD structure 22 is thus hidden in the planform view of PAIC 20 shown in FIG. 1. In other, more traditional designs lacking a vertically-integrated capacitor-AD structures, an APD or similar ESD protection element may be disposed adjacent MIM capacitor 46 in a side-by-side arrangement; e.g., in an alternative version of the illustrated example, an ESD protection element could potentially be fabricated in the multilayer system formed over semiconductor substrate 24 at a location to the left or right of MIM capacitor 46. Such an arrangement, however, occupies a considerably larger fraction of the available floor space of the PAIC 20 than does the illustrated capacitor-AD structure 22. Additionally, such side-by-side positioning of the MIM capacitor (or capacitors) and the AD (or ADs) can create a relatively tortuous electrical conduction path through the AD, which can potentially introduce undesired delay in the breakdown reaction time during an ESD event or otherwise negatively impact AD performance. For at least these reasons, the illustrated capacitor-AD structure 22 is provided with the vertically-integrated, three dimensional architecture, an example of which will now be discussed in connection with FIGS. 2-6. While only including a single vertically-integrated capacitor-AD structure 22 in the illustrated example, PAIC 20 (or another such PAIC) can include multiple instances of vertically-integrated capacitor-AD structures 22 in further implementations.

Figure 2:
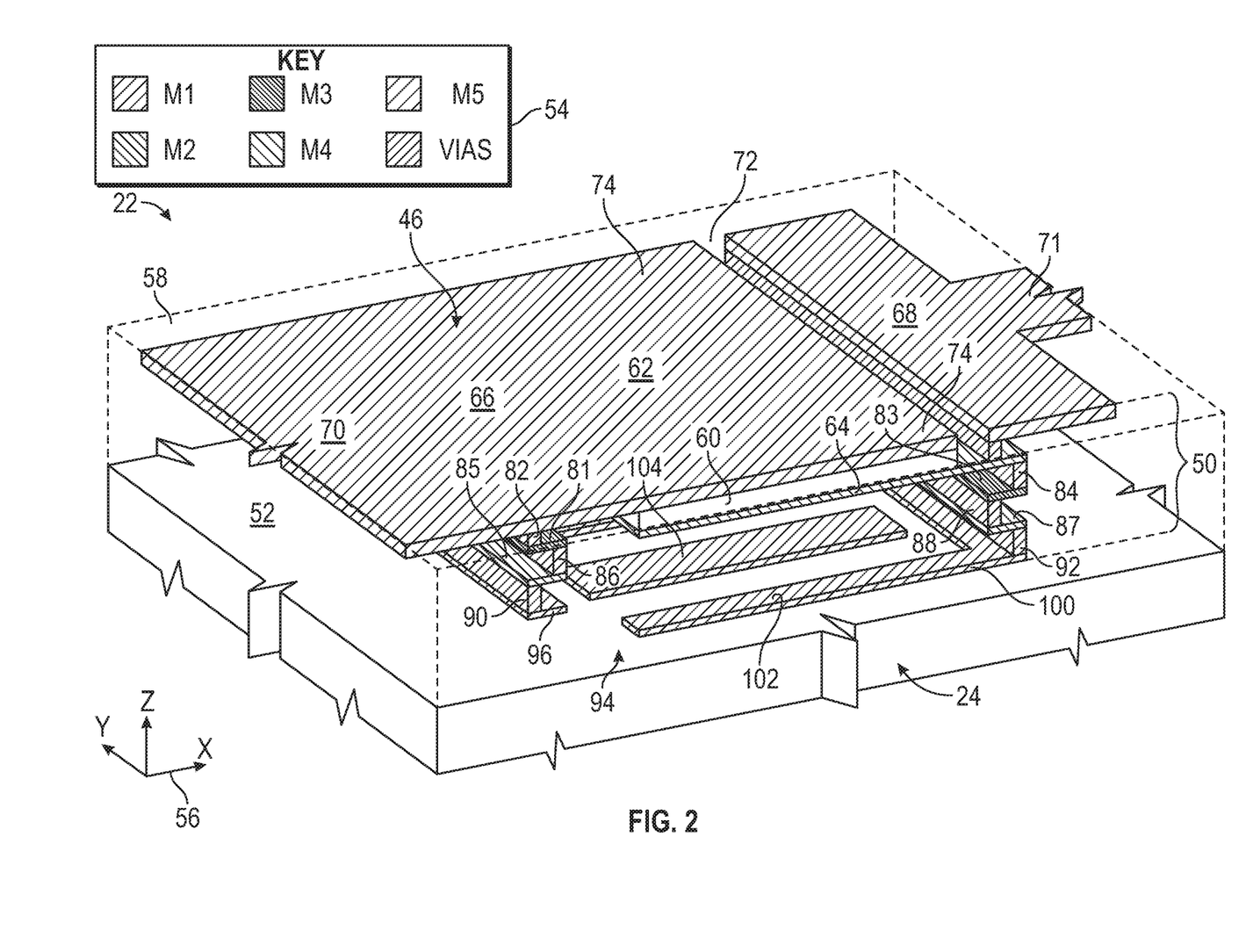
FIGS. 2, 3, and 4 are simplified isometric, top, and side views, respectively, of the example vertically-integrated capacitor-AD structure included in the PAIC die shown in FIG. 1.
Figure 3:
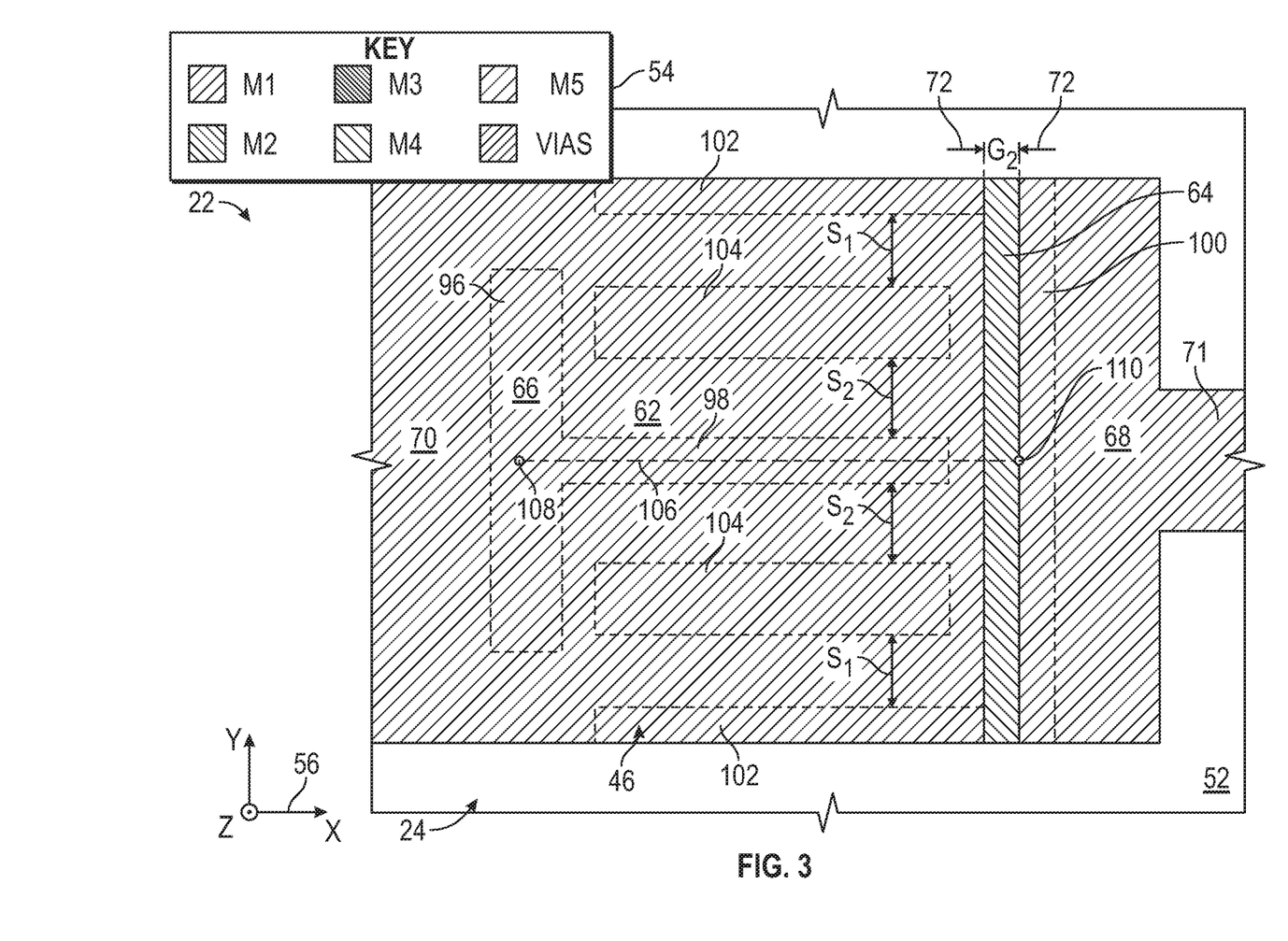
Figure 4:
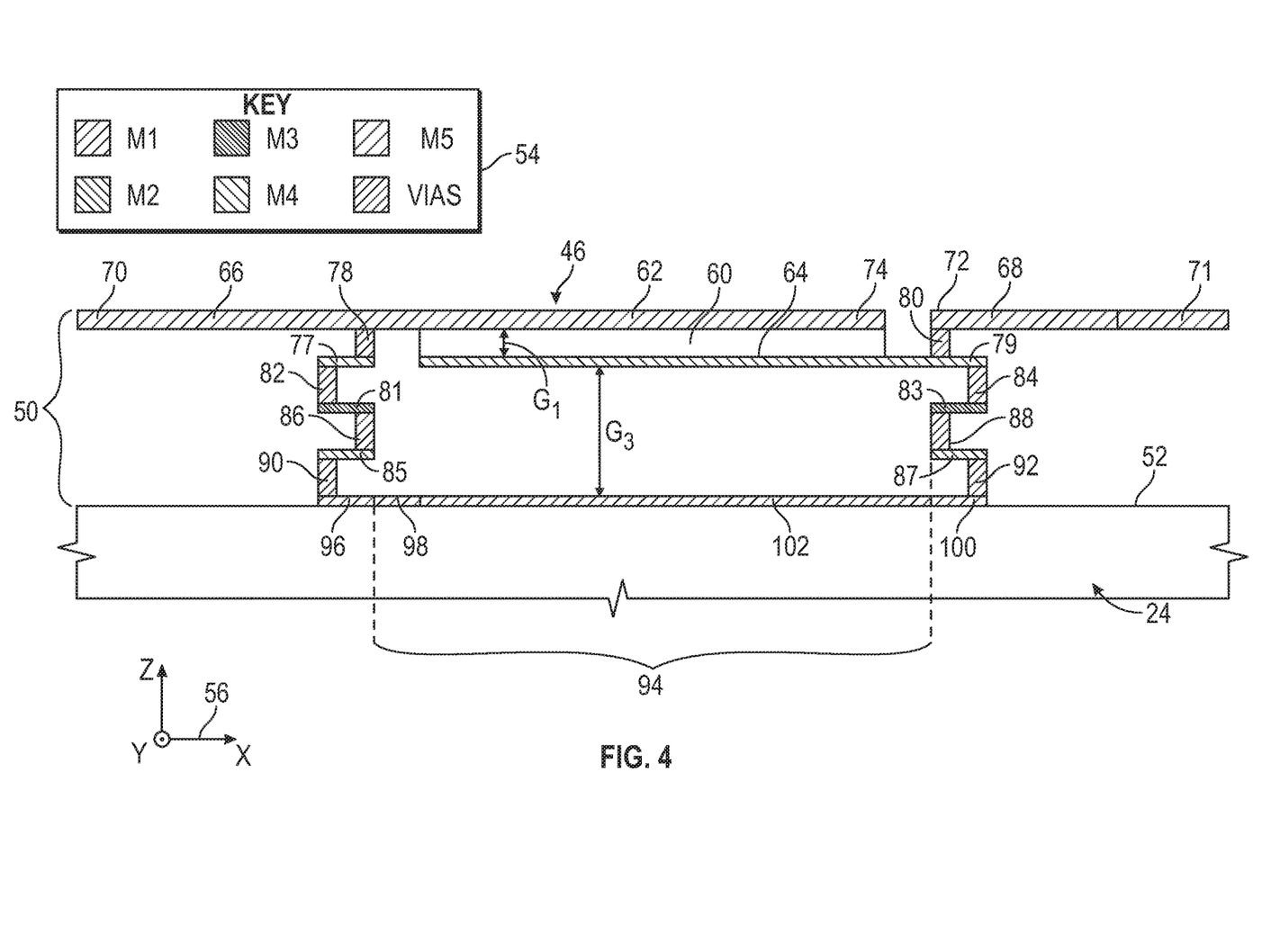
Figure 5:
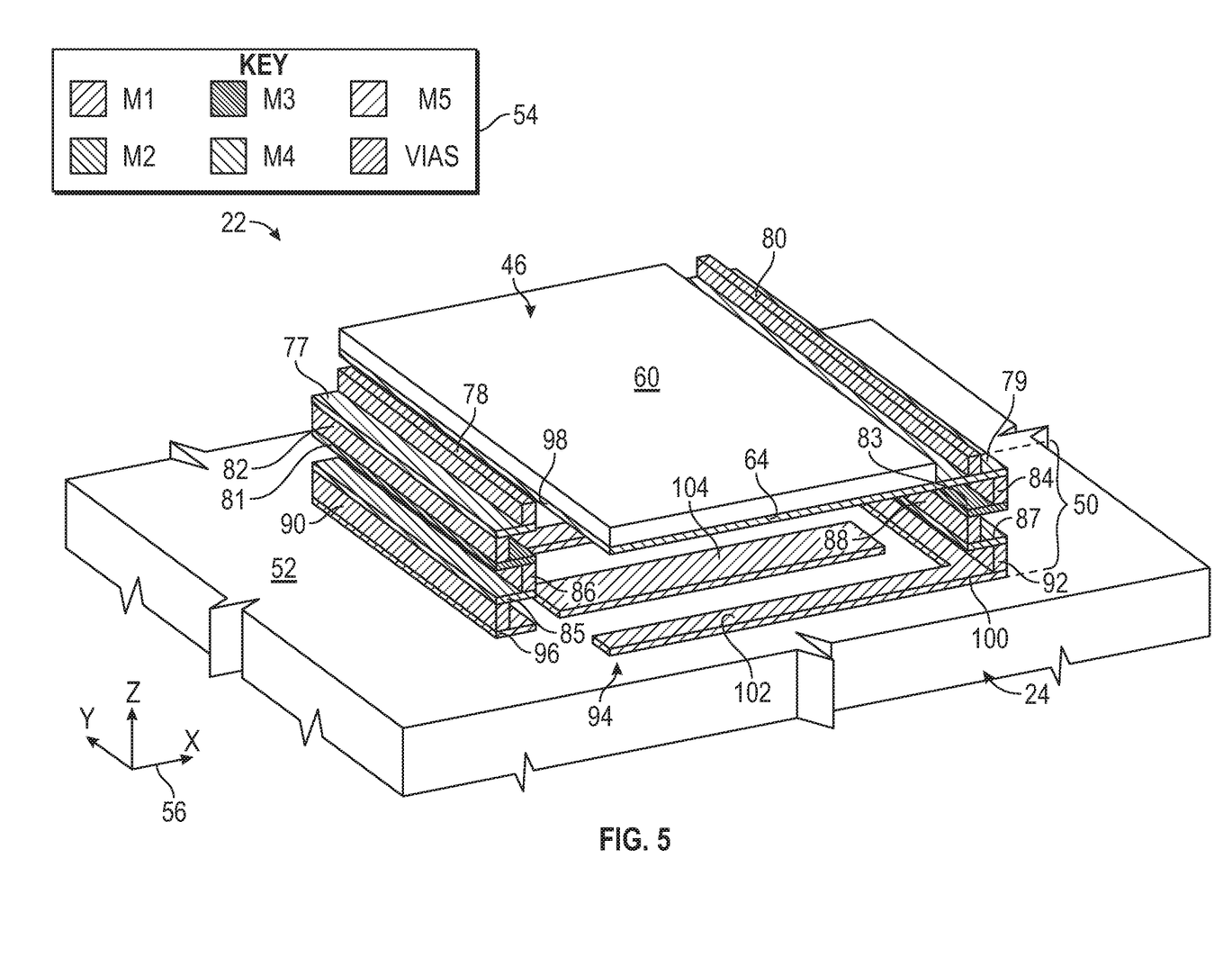
FIGS. 5 and 6 are isometric views of the example vertically-integrated capacitor-AD structure shown in FIGS. 2-3 with selected metal and dielectric layers removed to reveal the internal features of the capacitor-AD structure.

FIGS. 2, 3, and 4 are isometric, top-down, and side views, respectively, of vertically-integrated capacitor-AD structure 22, as depicted in accordance with an example embodiment of the present disclosure. In this particular example, vertically-integrated capacitor-AD structure 22 is fabricated substantially within a metal layer system 50 including five metal levels or layers, which are successively deposited over an upper principal surface 52 of semiconductor substrate 24. Upper principal surface 52 of semiconductor substrate 24 is an active surface of substrate 24 at or on which power amplifier FET 26 is also fabricated; noting that portions of FET 26 will be located below surface 52 (e.g., the doped source and drain regions of FET 26), while other portions of FET 26 are located above surface 52 (e.g., the gate and drain lines). The first-formed patterned metal layer included in metal layer system 50 contacts upper principal surface 52 of semiconductor substrate 24. This patterned metal layer is referred to hereafter as the "M1" metal layer by common nomenclature, as indicated by a key 54 appearing in the upper left of FIGS. 2-4.

Continuing the naming convention of the previous paragraph, the second-formed patterned metal layer included in metal layer system 50 (that is, the metal layer deposited over the M1 metal layer, as seen looking downwardly onto upper principal surface 52 along a vertical axis orthogonal to surface 52 and corresponding to the Z-axis of coordinate legend 56) is referred to herein as the "M2" metal layer. The third-formed patterned metal layer deposited over the M2 metal layer is referred to as the "M3" metal layer; the fourth-formed patterned metal layer deposited over the M3 metal layer is referred to as the "M4" metal layer; and, lastly, the fifth-formed patterned metal layer deposited over the M4 metal layer is referred to as the "M5" metal layer. As further indicated by key 54, different cross-hatch patterns are utilized to visually distinguish between the different metal layers, as well as between a number of vias connecting different patterned regions of the M1-M5 metal layers, as described below. While the M1-M5 layers are each referred to as a single "layer" by conventional practice, it will be appreciated that each of the M1-M5 layers may be composite structures composed of multiple layers in embodiments. For example, any one or all of the M1-M5 layers may be each be composed of a seed layer over which a thicker metal (e.g., copper or aluminum) layer is electroplated or otherwise deposited. This stated, the metal layers included in metal layer system 50 can be produced utilizing any suitable fabrication technique and composed of any electrically-conductive material or materials, providing the metal layers are predominately composed of at least one metal constituent by weight.

The M1-M5 metal layers are formed at different elevations or levels in a body of dielectric material 58. Dielectric body 58 is shown in phantom in FIG. 2 to more clearly reveal the internal features of vertically-integrated capacitor-AD structure 22. Although generally illustrated as a coherent mass, dielectric body 58 may be gradually compiled from multiple dielectric layers (deposited or grown) during the build-up process utilized to fabricate metal layer system 50. Additionally, a discrete body or layer of a dielectric material 60 may further be contained in metal layer system 50 in embodiments. Dielectric layer 60 may specifically provide electrical insulation between the plates of MIM capacitor 46 and may thus be referred to as "MIM dielectric layer 60" below. MIM dielectric layer 60 may be composed of a different dielectric material than is the larger surrounding dielectric body 58. Specifically, in various embodiments, MIM dielectric layer 60 is composed of a material having a higher dielectric constant than the dielectric constant of the larger body of dielectric material 58; e.g., MIM dielectric layer 60 may be composed of a nitride, such as silicon nitride (e.g., $Si_3N_4$), while dielectric body 58 may be composed of a silicon oxide (SiOx) vapor deposited utilizing, for example, a tetraethyl orthosilicate (TEOS) chemistry. Although not shown in FIGS. 2-4, additional layer(s) can be interspersed with or formed over the M1-M5 metal layers. For example, in some embodiments, one or more passivation layers may be formed over the M5 metal layer, as may any molded (e.g., thermoplastic) layers utilized to encapsulate PAIC 20 if contained in an encapsulated microelectronic package. In alternative implementations, metal layer system 50 may contain a greater or lesser number of metal layers, providing there exists a sufficient number of metal layers to form both MIM capacitor 46 and the below-described AD 94 underlying MIM capacitor 46.

In addition to MIM dielectric layer 60, MIM capacitor 46 further includes an upper, conductive capacitor electrode or plate 62 and a lower, conductive capacitor electrode or plate 64. Capacitor plates 62, 64 are separated or offset by a vertical gap or spacing, as identified in FIG. 4 by arrows $G_1$. As previously indicated, the term "vertical" is utilized herein to refer to an axis orthogonal to upper principal surface 52 of semiconductor substrate 24. The size of this separation gap ($G_1$), the dielectric constant of MIM dielectric layer 60, and the respective surface areas of capacitor plates 62, 64 can be selected, as desired, to impart MIM capacitor 46 with a desired capacitance. The capacitance of MIM capacitor 46 may range from about 0.5 to about 10 picofarads (pF) and, perhaps, from about 1 to about 5 pF in embodiments. In other implementations, the capacitance of MIM capacitor 46 may be greater than or less than the aforementioned ranges. Further, in embodiments, the vertical spacing between lower capacitor plate 64 and any given electrode or finger of the below-described AD (again, as measured along a vertical axis orthogonal to upper surface 52 of substrate 24) may be greater than G1 and, in some instances, may exceed G1 by a factor of at least two. This vertical spacing (here, measured between lower capacitor plate 64 and an outer contact finger 102 of AD 94, described below) is also identified in FIG. 4 by arrow G3.

Upper capacitor plate 62 is formed as a patterned portion or region of the uppermost metal (M5) layer. The illustrated portion of the M5 layer is also patterned to define a first terminal 66 and a second terminal 68 of vertically-integrated capacitor-AD structure 22. Terminals 66, 68 are the input and output terminals of vertically-integrated capacitor-AD structure 22 in the present example and are consequently respectively referred to as "input terminal 66" and "output terminal 68" below; however, terminal 66 can serve as an input terminal and terminal 68 can serve as a output terminal in further implementations, providing that an appropriate reverse bias is applied to the below-described AD. The M5 layer is also patterned to defined transmission lines 70, 71, which are partially shown in FIGS. 2-4. As best seen in FIG. 1, transmission line 70 electrically connects RF input terminal 34 to input terminal 66 of vertically-integrated capacitor-AD structure 22, while transmission line 71 electrically connects output terminal 68 of vertically-integrated capacitor-AD structure 22 to the gate terminal of FET 26 through spiral inductor 30. Transmission line 70, in particular, is formed as a relatively wide (e.g., microstrip) transmission line in the illustrated example and has a width substantially equivalent to input terminal 66 (which extends over or generally overlies the below-described conductive via 78, 82, 86, 90, as taken along a vertical axis). In other embodiments, the relative dimensions of transmission lines 70, 71 and the particular location at which vertically-integrated capacitor-AD structure 22 is integrated into PAIC 20 may vary.

Upper capacitor plate 62 extends from input terminal 66 toward output terminal 68 along a longitudinal axis of vertically-integrated capacitor-AD structure 22. In the illustrated example, the longitudinal axis of vertically-integrated capacitor-AD structure 22 corresponds to the X-axis of coordinate legend 56, with the longitudinal axis thus extending parallel to upper principal surface 52 and perpendicular to the previously-mentioned vertical axis. Upper capacitor plate 62 terminates prior to reaching output terminal 68 such that a longitudinal gap (G2, FIG. 3) separates upper capacitor plate 62 and output terminal 68 to prevent electrical bridging across MIM capacitor 46. Comparatively, lower capacitor plate 64 is formed at location beneath upper capacitor plate 62. For example, lower capacitor plate 64 may be formed in an underlying (e.g., M4) metal layer, which is further patterned to include two strip-like patterned regions 77, 79 to interconnect vias in the below-described via stacks. In this regard, vertically-integrated capacitor-AD structure 22 further includes two electrically-conductive vias 78, 80, which extend downwardly from the M5 layer to connect to M4 patterned portions 77, 79, respectively. As most clearly shown in FIG. 5 (illustrating vertically-integrated capacitor-AD structure 22 absent the top conductive (e.g., M5) layer), vias 78, 80 are formed as relatively large bar-shaped trench vias in the illustrated example. In other embodiments, vias 78, 80 may assume a different form; e.g., each via 78, 80 may be replaced by a plurality of smaller vias having generally circular planform geometries and arranged in one or more rows. Via 78 contacts and is at a location underlying the patterned region of the M5 layer defining input terminal 66. Similarly, via 80 contacts and is formed beneath the patterned portion of the M5 layer defining output terminal 68. Lower capacitor plate 64 extends from the portion of the metal layer (e.g., M4) contacting via 80 (underlying output terminal 68) toward via 78 (underlying input terminal 66), while terminating prior to reaching via 78 to provide an isolation gap similar to the above-mentioned isolation gap separating upper capacitor plate 62 and output terminal 68. MIM capacitor 46 is thus formed in the M4-M5 layers of metal layer system 50 to provide the desired capacitance; e.g., to block the application of direct current to the control terminal/gate of (e.g., Si LDMOS) FET 26.

Figure 6:
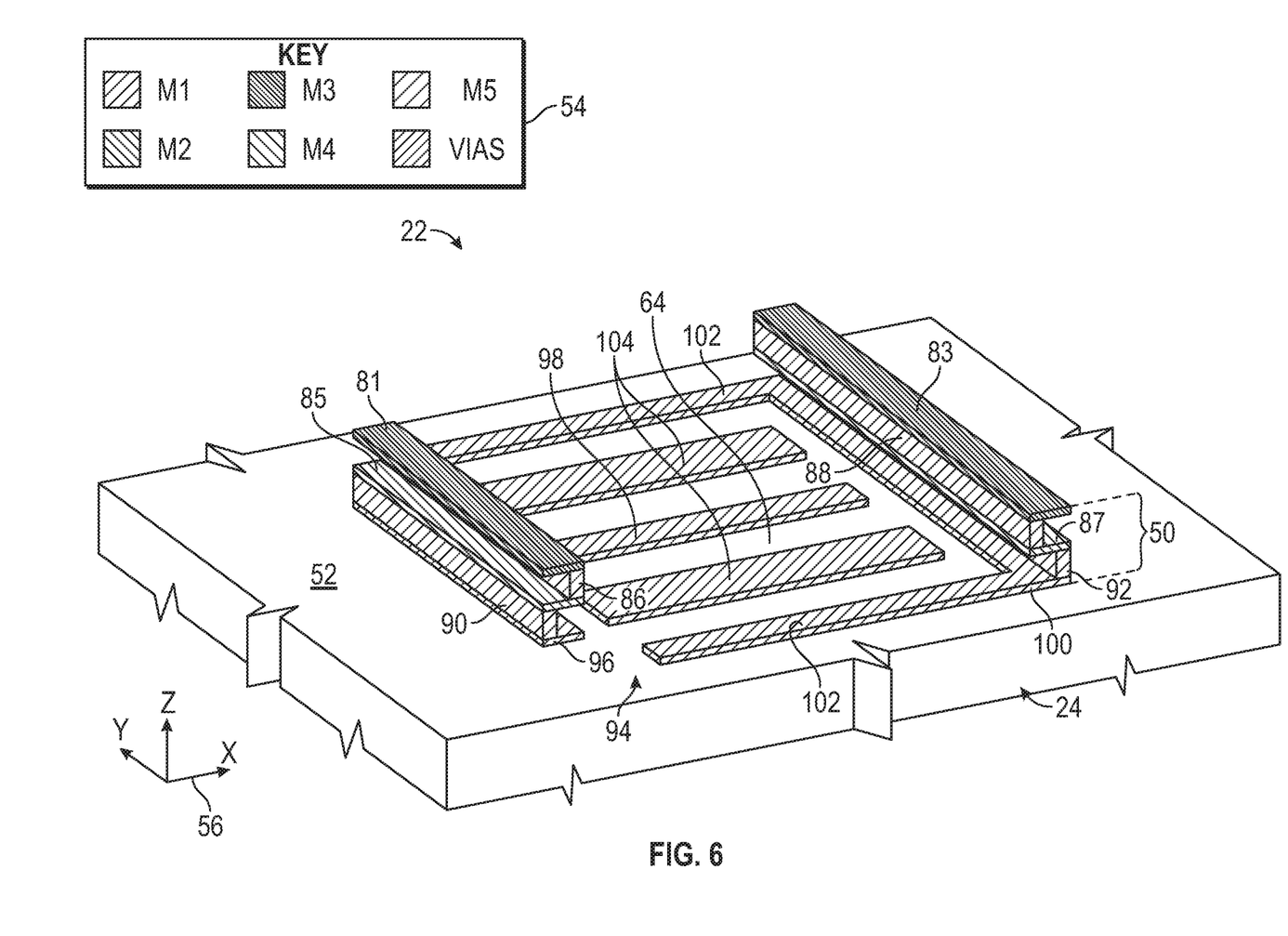

With continued reference to FIGS. 2-5, and referring also now to FIG. 6 (illustrating vertically-integrated capacitor-AD structure 22 absent the M4-M5 layers and MIM dielectric layer 60), at least one AD 94 is further formed in metal layer system 50 at an elevation beneath MIM capacitor 46 to protect at least MIM capacitor 46 from ESD damage. In the illustrated example, and as shown most clearly in FIG. 6, a single AD 94 is created by patterning the M1 layer contacting upper principal surface 52 of semiconductor substrate 24 to include certain features. Those of skill in the art would understand, based on the description herein, that an AD 94 may be formed from patterned portions of one or more different layers underlying the MIM capacitor 46 (e.g., the M2 or M3 layer(s)). The features of AD 94 include: (i) a first AD terminal or manifold 96 from which at least one elongated electrode or contact finger 98 extends (or to which at least one elongated electrode or contact finger 98 is electrically coupled), (ii) a second AD terminal or manifold 100 from which at least one elongated electrode or contact finger 102 extends (or two which at least one elongated electrode or contact finger 102 is electrically coupled), and (iii) a number of electrically-floating fingers 104. Such features (and the M1 layer generally) may be electrically coupled to the semiconductor material of substrate 24 by a non-illustrated electrically-conductive (e.g., silicide) contact layer in embodiments. Additionally, in at least some implementations, electrically-floating fingers 104 could potentially be electrically coupled to ground by TSVs formed in substrate 24 to divert at least a fraction of current to ground during an ESD event.

Given the respective lateral positioning of contact fingers 98, 102 in the embodiment shown in FIGS. 2-6, contact finger 98 is referred to as "central contact finger 98," while contact fingers 102 are referred to as "outer contact fingers 102". Central contact finger 98 extends from AD manifold 96 toward opposing AD manifold 100, with central contact finger 98 terminating before reaching AD manifold 100 and separated from manifold 100 by an isolation gap. This gap may have a width similar, if not identical to the width of isolation gap G2 in embodiments and/or may underly isolation gap G2 along a vertical axis orthogonal to upper surface 52 of semiconductor substrate 24. Conversely, outer contact fingers 102 extend from AD manifold 100 toward opposing AD manifold 96, with outer contact fingers 102 likewise terminating before reaching AD manifold 96. Contact fingers 98, 102 extend parallel to one another and are spaced along a lateral axis of PAIC 20, which is parallel to upper principal surface 52 of semiconductor substrate 24 and perpendicular to the vertical axis along which capacitor plates 62, 64 are spaced (the lateral axis corresponding to the Y-axis of coordinate legend 56). Floating contact fingers 104 likewise extend parallel to contact fingers 98, 102, while disposed in a non-contacting, electrically-isolated relationship (until activation of AD 94) with both AD manifolds 96, 100. Contact fingers 98, 102, 104 are elongated along a longitudinal axis perpendicular to the above-described vertical and lateral axes (again, the longitudinal axis corresponding to the X-axis of coordinate legend 56).

In the illustrated embodiment, and as identified in FIG. 3, outer contact fingers 102 extend from AD manifold 100 and are each spaced from the adjacent floating contact finger 104 by a first spacing S1, as taken along a lateral axis of PAIC 20 (again, corresponding to the Y-axis of coordinate legend 56). Further, each floating contact finger 104 is spaced from central contact finger 98 by a second spacing S2 along the lateral axis. In an embodiment, spacings S1 and S2 may be substantially equal and/or spacings S1 and S2 may each be greater than the vertical spacing separating capacitor plates 62, 64 of MIM capacitor 46. In other embodiments, S1 and S2 may vary relative to the vertical spacing separating capacitor plates 62, 64. So too may the respective dimensions and number of contact fingers 98, 102, 104 vary between embodiments (with AD 94 potentially lacking floating contact fingers 104 in some implementations) depending upon the desired operational characteristics (e.g., breakdown voltage) of AD 94, the surface area allotted for formation of AD 94, and other such factors. Generally, then, it should be understood that the particular topology, dimensions, and shape of those circuit elements making-up AD 94 are tunable parameters that can and will vary between embodiments, providing that AD 94 is capable of allowing current flow to bypass MIM capacitor 46 when reversed biased and the breakdown voltage is surpassed during operation of PAIC 20.

In embodiments, AD 94 may have a trigger voltage between 100 and 300 volts (V) and, perhaps, a trigger voltage between about 160 to about 200V. Comparatively, MIM capacitor 46 may have an operating voltage between about 5 and 75V; and, perhaps, an operating voltage between about 10 and 40V. In other embodiments, the trigger voltage of AD 94 and the operating voltage of MIM capacitor 46 may be greater than or less than the aforementioned ranges. In some instances, the operating voltage of MIM capacitor 46 may be at least five times higher (and, in certain cases, between approximately six and nine times higher) than the trigger voltage of AD 94. Finally, although not shown in FIGS. 3-6 for clarity, a dielectric material (as included in dielectric body 58, FIG. 2) fills the space between contact fingers 98, 102, 104. Such a topology (contact finger or electrode arrangement) imparts AD 94 with a back-to-back diode arrangement in the present example; that is, contact fingers 98, 102, 104 combine with semiconductor substrate 24 to form at least two avalanche diode elements arranged in a back-to-back configuration in the embodiment of FIGS. 2-6. Other AD topologies can be employed in alternative embodiments of vertically-integrated capacitor-AD structure 22.

As shown most clearly in FIG. 4, a first conductive via stack 78, 82, 86, 90 (including vias 78, 82, 86, 90) and a second conductive via stack 80, 84, 88, 92 (including vias 80, 84, 88, 92) are further formed in metal layer system 50 to provide electrical interconnection vertically through the metal layers of system 50 and, specifically, between MIM capacitor 46 and AD 94. To formed via stack 78, 82, 86, 90 and via stack 80, 84, 88, 92, M4-M5 vias 78, 80 extend between (and thus electrically connect) patterned portions 66, 68 of the M5 layer and patterned portions 77, 79 of the M4 layer, respectively. M3-M4 vias 82, 84 extend between (and electrically connect) patterned portions 77, 79 of the M4 layer and patterned portions 81, 83 of the M3 layer, respectively. M2-M3 vias 86, 88 extend between and electrically connect patterned portions 81, 83 of the M3 layer and patterned portions 85, 87 of the M2 layer. Finally, M2-M1 vias 90, 92 extend between and electrically connect patterned portions 85, 87 of the M2 layer and patterned portions 96, 100 (here, AD manifolds 96, 100) of the M1 layer, as shown. Via stack 78, 82, 86, 90 thus provides a relatively robust electrical path is thus formed between input terminal 70 of vertically-integrated capacitor-AD structure 22 and AD manifold 96. Similarly, via stack 80, 84, 88, 92 provides a relatively robust electrical connection between electrically connects AD manifold 100 and output terminal 68 of vertically-integrated capacitor-AD structure 22.

By virtue of the above-described wiring structure, AD 94 and MIM capacitor 46 are electrically coupled in parallel. During normal operation, electrical current is conducted from input terminal 66 to output terminal 68 when MIM capacitor 46 discharges current, while effectively zero current is passed through AD 94 excluding any negligible current leakage. Comparatively, during an ESD event, the breakdown voltage across AD 94 (and specifically in the semiconductor regions underlying the electrodes or contact fingers 98, 102, 104 of AD 94) is rapidly surpassed and a low resistance electrical path opens through the AD 94 to allow current to flow from input terminal 66 to output terminal 68, while bypassing MIM capacitor 46. In this manner, the provision of AD 94 protects MIM capacitor 46 from overvoltage damage during any ESD events that may occur. While providing effective ESD protection, vertically-integrated capacitor-AD structure 22 has a relatively compact footprint due, at least in substantial part, to the three dimensional, vertically-overlapping architecture of structure 22. In embodiments, the footprint of vertically-integrated capacitor-AD structure 22 may be approximately two-thirds or less relative to a comparable structure including a MIM capacitor and a parallel-coupled AD positioned in a side-by-side or non-overlapping relationship. Consequently, the incorporation of vertically-integrated capacitor-AD structure 22 into PAIC 20 frees additional die space that may be leveraged to increase the dimensions of other components or, instead, to allow a reduction in the planform dimension of semiconductor substrate 24 (the die body) for cost savings, particularly in implementations in which multiple instances of vertically-integrated capacitor-AD structure 22 are present.

Adoption of vertically-integrated capacitor-AD structure 22 into existing process flows is streamlined as standard metal deposition and patterning techniques can be employed to produce vertically-integrated capacitor-AD structure 22 along with the integral features or devices within metal layer system 50. As a still further benefit, and in contrast to other possible architectures placing a MIM capacitor and an AD in a non-overlapping, side-by-side relationship, a relatively direct, non-tortuous current conduction path is provided through AD 94. This may be appreciated by referring to FIG. 3 in which dashed line 106 represents a current conduction path extending through AD 94 (when the breakdown voltage is surpassed) from input terminal 66 (represented by a current injection point or first node 108) to output terminal 68 (represented by a second node 110). As indicated by line 106, the current conduction path through AD 94 follows a substantially linear path, as seen looking downwardly onto vertically-integrated capacitor-AD structure 22 along a vertical axis orthogonal to substrate surface 52. Stated differently, a straight line (line 106) can be drawn between input terminal 66 and output terminal 68 (as seen looking downwardly on principal surface 52 of semiconductor substrate 24 along the vertical axis), with the straight line transecting (and perhaps bisecting) both MIM capacitor 46 and AD 94.

There has thus been provided an example embodiment of an integrated circuit (i.e., PAIC 20) including at least one vertically-integrated capacitor-AD structure (i.e., vertically-integrated capacitor-AD structure 22). In further implementations, vertically-integrated capacitor-AD structure 22 can be modified to varying extents, while continuing to provide the desired capacitance and ESD-protection functions in a highly compact footprint. For example, in embodiments, the vertically-integrated capacitor-AD structure 22 can contain multiple MIM capacitors and/or multiple ADs, which may be electrically interconnected in various manners. Further emphasizing this point, several additional examples of vertically-integrated capacitor-AD structures containing multiple MIM capacitors and/or multiple ADs will now be described in conjunction with FIGS. 7-11.

Figure 7:
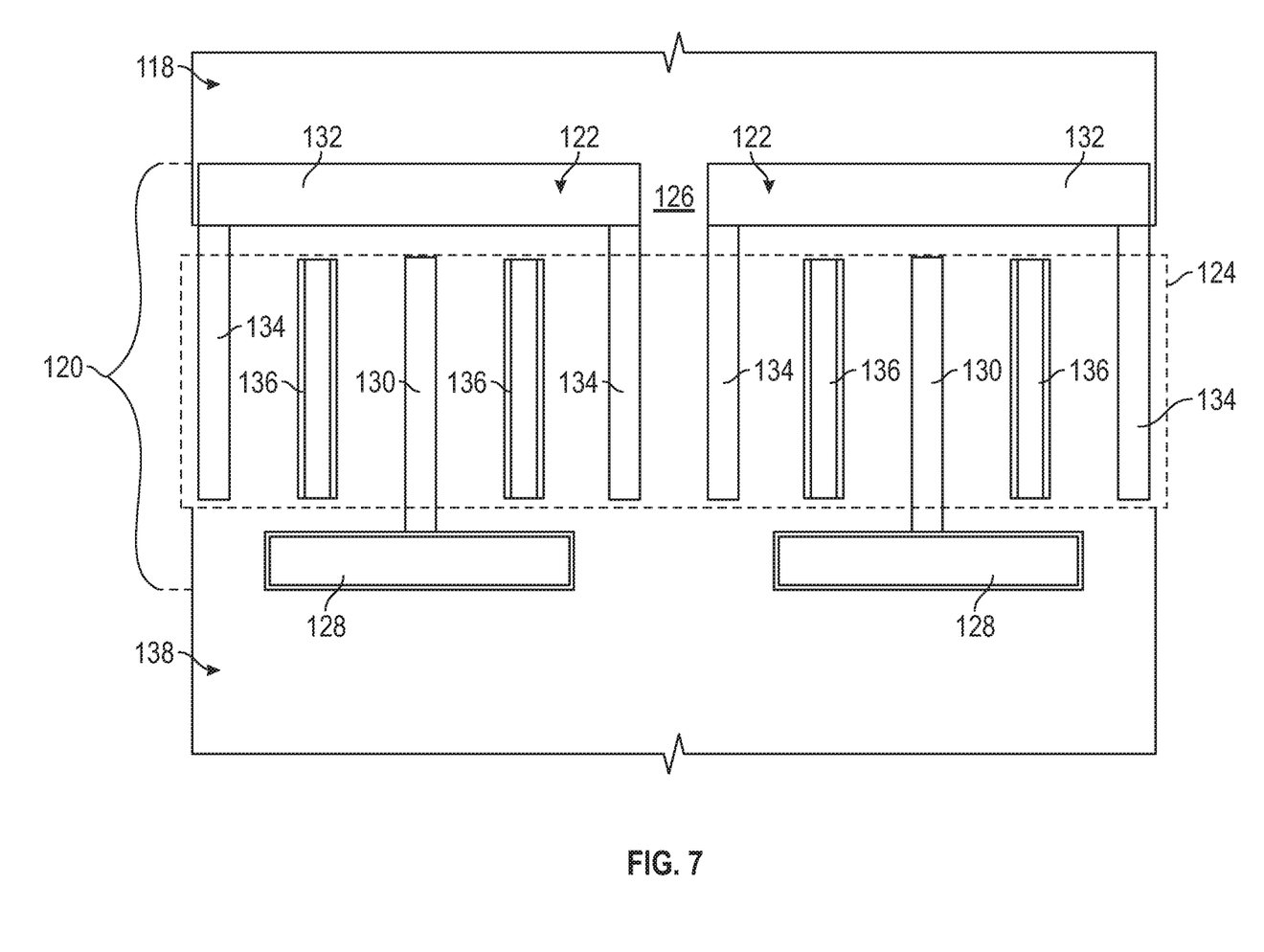
FIG. 7 is a simplified planform view of a vertically-integrated capacitor-AD structure including two ADs (here, two APDs) underlying a single MIM capacitor structure, as illustrated in accordance with a further example embodiment.

Additional Examples of Power Amplifier Integrated Circuit Containing Vertically-Integrated Capacitor-Avalanche Diode Structures Advancing to FIG. 7, a simplified planform view of an example vertically-integrated capacitor-AD structure 118 is shown. In this example, vertically-integrated capacitor-AD structure 118 includes a single MIM capacitor 120, which extends over a neighboring (laterally-adjacent) pair of ADs 122; e.g., two APDs formed over a semiconductor substrate.

A dashed box 124 represents the vertically-overlapping portion of the capacitor plates included in MIM capacitor 120. ADs 122 are disposed in a side-by-side relationship and separated by a lateral gap 126; however, a majority, if not the substantial entirety (or entirety) of each AD 122 overlaps with MIM capacitor 120 as taken along an axis orthogonal to the upper surface of a semiconductor substrate on which vertically-integrated capacitor-AD structure 118 is formed. MIM capacitor 120 may be substantially identical to MIM capacitor 46 described above in connection with FIGS. 1-6 and is thus not again discussed in detail to avoid redundancy. ADs 122 are likewise similar to, if not substantially identical to AD 94, albeit with the respective widths of ADs 122 reduced (or the width of MIM capacitor 120 increased) to enable positioning of two ADs 122 beneath MIM capacitor 120 in a partially or wholly vertically-overlapping relationship as shown. Accordingly, and as was previously the case, each AD 122 includes a first manifold 128 from which a central contact finger 130 extends, a second manifold 132 from which outer contact fingers 134 extend, and floating contact fingers 136 laterally-interspersed with contact fingers 130, 134 in an interdigitated or interspersed relationship. Once again, the features defining ADs 122 are defined by pattern regions of the initially-deposited or "M1" metal layer of a metal layer system 138 in which vertically-integrated capacitor-AD structure 118 is formed, the M1 metal layer contacting a principal surface of the semiconductor substrate over which metal layer system 138 is formed. ADs 122 are illustrated as substantially identical in the example of FIG. 7, but may vary relative to each other in further realizations of vertically-integrated capacitor-AD structure 118.

Figure 8:
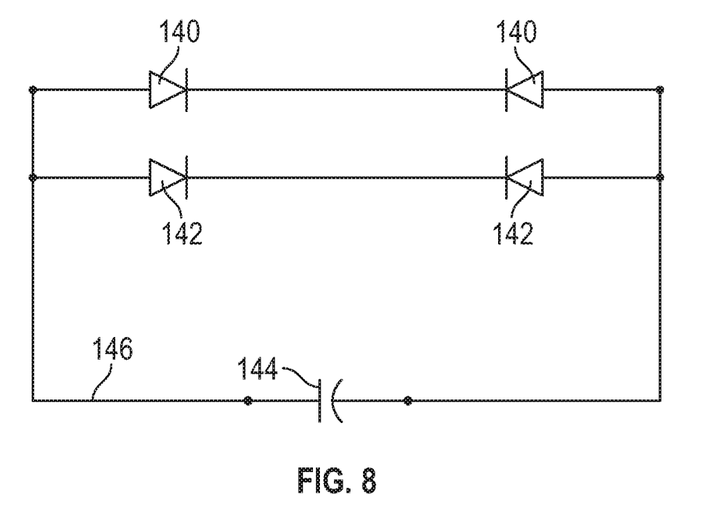
FIG. 8 is an example circuit diagram corresponding to the vertically-integrated capacitor-AD structure shown in FIG. 7 in an example implementation in which the ADs are electrically connected in parallel.
Figure 9:
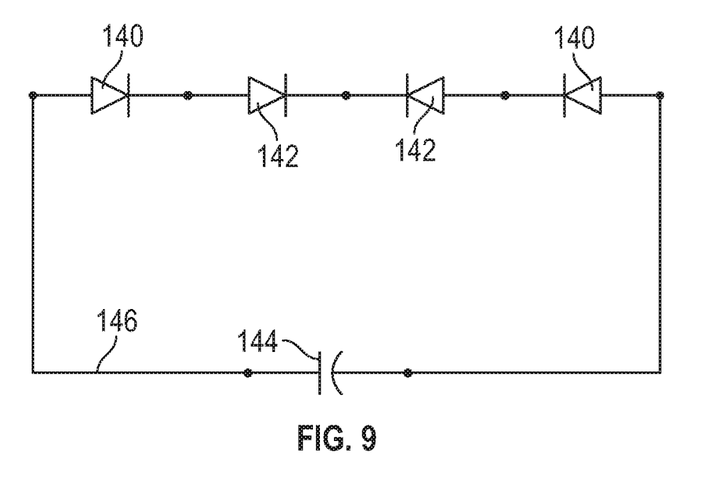
FIG. 9 is an example circuit diagram corresponding to the vertically-integrated capacitor-AD structure shown in FIG. 7 in an example implementation in which the ADs are electrically connected in series.
Figure 10:
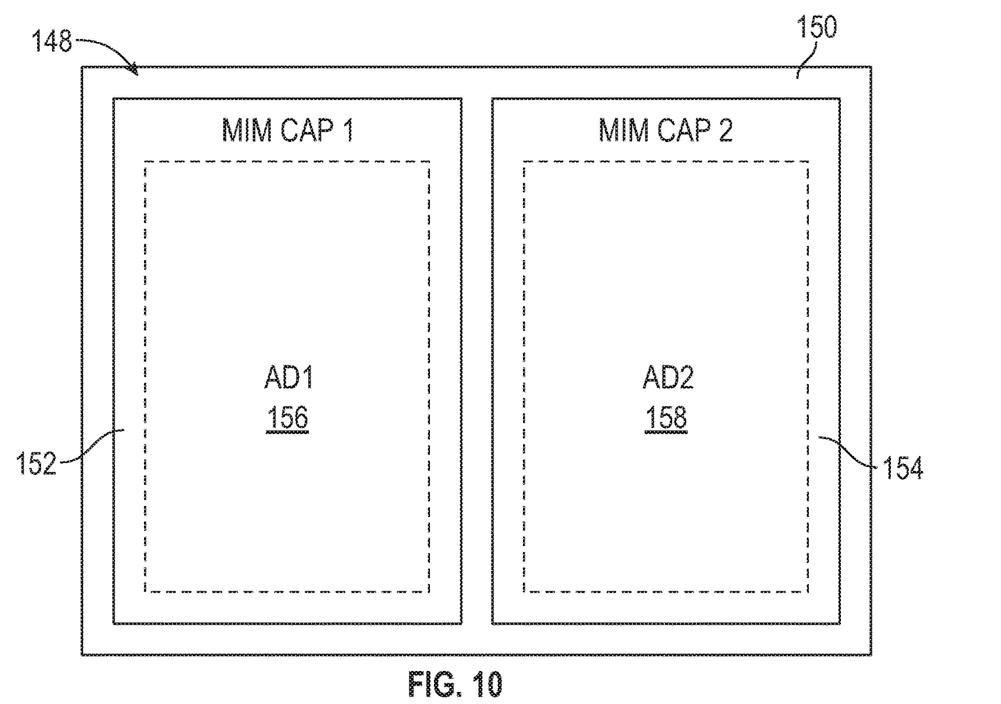
FIG. 10 is a simplified planform view of a vertically-integrated capacitor-AD structure including two ADs (here, two APDs) underlying separate MIM capacitor structures, as illustrated in accordance with a further example embodiment of the present disclosure.

Electrically-conductive interconnect features, such as metal traces and plugs or vias, are formed in metal layer system 138 to electrically couple ADs 122 in parallel or in series between the input and output electrodes of vertically-integrated capacitor-AD structure 118. FIG. 8 is a circuit schematic illustrating vertically-integrated capacitor-AD structure 118 when ADs 122 are electrically coupled in parallel, while FIG. 9 is a circuit schematic illustrating capacitor-AD structure 118 when ADs 122 are electrically coupled in series. In the circuit schematics of FIGS. 8 and 9, diode symbols 140 correspond to one of ADs 122 shown in FIG. 7, while diode symbols 142 correspond to the other of ADs 122. Capacitor symbol 144 corresponds to MIM capacitor 120, while the various interconnect lines 146 represent the conductive features (traces or interconnect lines and conductive vias) formed in metal layer system 138. Relative to the series arrangement of ADs 122 shown in FIG. 8, the parallel arrangement of ADs 122 (FIG. 7) may increase the reaction time of and current conduction through ADs 122 during an ESD event Comparatively, relative to the parallel arrangement of ADs 122 shown in FIG. 7, the series arrangement of ADs 122 (FIG. 8) may provide a higher voltage threshold and lower current leakage during operation of vertically-integrated capacitor-AD structure 118.

Figure 11:
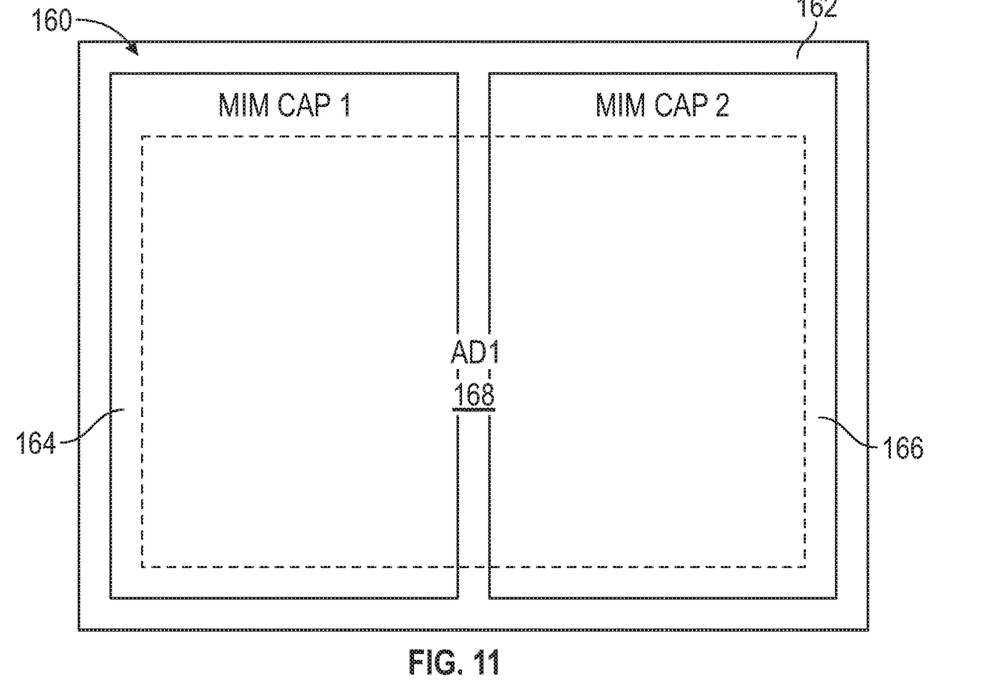
FIG. 11 is a simplified planform view of a vertically-integrated capacitor-AD structure including a single AD underlying two discrete or separate MIM capacitor structures, as illustrated in accordance with a still further example embodiment of the present disclosure.

Various other vertically-integrated capacitor-AD structures are possible in still further realizations. For example, as shown in the simplified diagram of FIG. 10, a vertically-integrated capacitor-AD structure 148 can be fabricated in the metal layer system formed over a semiconductor substrate 150 including dual MIM capacitors 152, 154 and dual ADs 156, 158, with AD 156 and AD 158 disposed beneath (and thus vertically overlapped in their entireties by) MIM capacitors 152, 154, respectively. In such an embodiment, MIM capacitors 152, 154 can be identical or may differ and thus provide differing capacitances. Similarly, ADs 156, 158 can be similar or differ; e.g., in an embodiment in which MIM capacitor 152 is more susceptible to ESD damage relative to MIM capacitor 154, AD 156 (electrically coupled in parallel with MIM capacitor 152) may be configured to provide a lower breakdown voltage than AD 158 (electrically coupled in parallel with MIM capacitor 154). In such an embodiment, ADs 156, 158 can be electrically coupled in parallel or in series in a manner akin to that described above in connection with FIGS. 7-9. In other instances, and as indicated in FIG. 11, a vertically-integrated capacitor-AD structure 160 can be produced in the metal layer system formed over a semiconductor substrate 162 including two MIM capacitors 164, 166 and a single AD 168, which is vertically overlapped by both MIM capacitors 164, 166. Various other implementations are also possible including any practical of MIM capacitors and ADs in a given vertically-integrated capacitor-AD structure. Additionally, in embodiments in which there exists a sufficient number of metal layers or levels, two MIM capacitors can potentially be formed in a metal layer system and likewise positioned in a stacked or vertically-overlapping relationship such that a first MIM capacitor overlies a second MIM capacitor, which then overlies one or more ADs located beneath the second MIM capacitor at an interface between the first-formed (M1) metal layer and a semiconductor substrate.

CONCLUSION

There has thus been provided PAICs and other integrated circuits including vertically-integrated capacitor-AD structures. In the above-described manner, an integrated circuit can be produced having a reduced-footprint vertically-integrated capacitor-AD structure. In addition to IC area savings, embodiments of the vertically-integrated capacitor-AD structure may also provide certain performance benefits, such as providing a more direct current conduction path through the AD element(s) of the capacitor-AD structure, reduced parasitic capacitance, low current leakage, and/or other such benefits. As a still further advantage, embodiments of the vertically-integrated capacitor-AD structure also provide design flexibility allowing different combinations of MIM capacitors and AD elements to be integrated into a given vertically-integrated capacitor-AD structure with different interconnect topologies; e.g., in embodiments in which the two AD elements are integrated into a vertically-integrated capacitor-AD structure, interconnect features may be formed to either connect the AD elements in parallel or in series for increased breakdown voltage and reduced leakage characteristics. As a still further benefits, embodiments of the vertically-integrated capacitor-AD structure can be integrated into existing manufacturing process flows and IC designs with minimal cost and design modifications. Embodiments of the integrated circuit described herein are consequently well-suited for usage within power amplifier applications in which a compact capacitance-ESD protection solution is sought including, but not limited to, massive MIMO and small cell applications. Accordingly, in embodiments, the integrated circuit may assume the form of a PAIC including a FET configured to amplify a RF signal during operation, and the vertically-integrated capacitor-AD structure may be electrically coupled to an input terminal (e.g., the gate control terminal) of the FET.

In embodiments, a PAIC or other integrated circuit includes a semiconductor substrate having a principal surface, a metal layer system, and a vertically-integrated capacitor-AD structure formed in the metal layer system.

The metal layer system includes, in turn, a body of dielectric material in which a plurality of patterned metal layers are located. The vertically-integrated capacitor-AD structure includes a first AD formed, at least in part, by patterned portions of the first patterned metal layer. A first MIM capacitor is also formed in the metal layer system and at least partially overlaps with the first AD, as taken along a vertical axis orthogonal to the principal surface of the semiconductor substrate. In certain instances, at least a majority, if not the entirety of the first AD vertically overlaps with the first MIM capacitor, by surface area, as taken along the vertical axis. In other embodiments, the PAIC further includes a power amplifier transistor formed on the semiconductor substrate and electrically coupled to the vertically-integrated capacitor-AD structure; e.g., the power amplifier transistor may assume the form of FET having a gate terminal, and the vertically-integrated capacitor-AD structure may be electrically coupled between the gate terminal of the FET and a gate control terminal of the integrated circuit.

In further embodiments, a PAIC includes a semiconductor substrate having an upper surface on which an input terminal is located, a metal layer system formed over the upper surface of the semiconductor substrate; a power amplifier transistor further formed on the semiconductor substrate and electrically coupled to the input terminal, and a MIM capacitor formed in the metal layer system and electrically coupled between the input terminal and the power amplifier transistor. An AD is further formed in the metal layer system, electrically coupled in parallel with the MIM capacitor, and located between the upper surface of the semiconductor substrate and the MIM capacitor along a vertical axis orthogonal to the upper surface of the semiconductor substrate. In certain implementations, the AD includes a plurality of contact fingers, which combine with the semiconductor substrate to form at least two diode elements arranged in a back-to-back configuration. Additionally or alternatively, in embodiments, the MIM capacitor may include an upper capacitor plate and a lower capacitor plate, while the metal layer system includes: (i) a first metal layer (e.g., the above-described M1 layer) in which the AD is formed; (ii) outer metal layers (e.g., the above-described M4-M5 layers) in which the upper capacitor plate and the lower capacitor plate are formed, the outer metal layers located further from the semiconductor substrate than is the first metal layer; and (iii) at least one intervening metal layer (e.g., the above-described M2-M3 layers) located between the first metal layer and the outer metal layer along the vertical axis.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements (e.g., package leads, transistors, and transistor-carrying die) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. An integrated circuit, comprising:
   a semiconductor substrate having a principal surface;
   a metal layer system, comprising:
      a body of dielectric material, and
      a plurality of patterned metal layers located in the body of dielectric material, the plurality of patterned metal layers including a first patterned metal layer contacting the principal surface of the semiconductor substrate;
   a vertically-integrated capacitor-avalanche diode (AD) structure formed in the metal layer system, the vertically-integrated capacitor-AD structure comprising:
      a first AD formed, at least in part, by patterned portions of the first patterned metal layer, and
      a first metal-insulator-metal (MIM) capacitor formed in the metal layer system and at least partially overlapping with the first AD along a vertical axis orthogonal to the principal surface of the semiconductor substrate; and
   a power amplifier transistor formed on the semiconductor substrate and electrically coupled to the vertically-integrated capacitor-AD structure.

2. The integrated circuit of claim 1, wherein at least a majority of the first AD vertically overlaps with the first MIM capacitor, by surface area, as taken along the vertical axis.

3. The integrated circuit of claim 1, wherein the power amplifier transistor comprises a field effect transistor (FET) having a gate terminal;
   wherein the semiconductor die further comprises an input terminal; and
   wherein the vertically-integrated capacitor-AD structure is electrically coupled between the input terminal and the gate terminal.

4. The integrated circuit of claim 1, wherein the semiconductor substrate comprises a silicon-containing semiconductor die; and
   wherein the first AD comprises an avalanche poly diode.

5. The integrated circuit of claim 1, wherein the first MIM capacitor comprises:
   an upper capacitor plate and a lower capacitor plate formed in different patterned metal layers included within the plurality of patterned metal layers, the lower capacitor plate located closer to the semiconductor substrate than is the upper capacitor plate along the vertical axis; and
   a dielectric layer separating the upper capacitor plate and lower capacitor plate, the dielectric layer having a higher dielectric constant than does the body of dielectric material.

6. The integrated circuit of claim 5, wherein the upper capacitor plate and the lower capacitor plate are separated by a first vertical spacing along the vertical axis; and
   wherein the lower capacitor plate and the first AD are separated by a second vertical spacing along the vertical axis, the second vertical spacing greater than the first vertical spacing.

7. The integrated circuit of claim 5, wherein the first AD comprises:
a first AD manifold;
a second AD manifold spaced from the first AD manifold along a longitudinal axis parallel to the upper surface of the semiconductor substrate and perpendicular to the vertical axis;
a first contact finger extending from the first AD manifold toward the second AD manifold, while terminating before reaching the second AD manifold; and
a second contact finger extending from the second AD manifold toward the first contact finger, while terminating before reaching the first AD manifold, the second contact finger spaced from the first contact finger along a lateral axis perpendicular to the longitudinal axis and perpendicular to the vertical axis.

8. The integrated circuit of claim 7, further comprising:
a first conductive via stack formed in the metal layer system and electrically connecting the upper capacitor plate to the first AD manifold; and
a second conductive via stack formed in the metal layer system and electrically connecting the lower capacitor plate to the second AD manifold.

9. The integrated circuit of claim 1, further comprising a second AD formed in the first patterned metal layer at a location adjacent the first AD.

10. The integrated circuit of claim 9, wherein the first and second ADs are electrically coupled in series.

11. The integrated circuit of claim 9, wherein the first and second ADs are electrically coupled in parallel.

12. The integrated circuit of claim 1, further comprising:
a second AD formed in the first patterned metal layer at a location adjacent the first AD; and
a second MIM capacitor formed in the metal layer system at a location adjacent the first MIM capacitor, at least a portion of the second AD vertically overlapping with the second MIM capacitor along the vertical axis.

13. An integrated circuit, comprising:
a semiconductor substrate having a principal surface;
a metal layer system, comprising:
a body of dielectric material; and
a plurality of patterned metal layers located in the body of dielectric material, the plurality of patterned metal layers including a first patterned metal layer contacting the principal surface of the semiconductor substrate;
a vertically-integrated capacitor-avalanche diode (AD) structure formed in the metal layer system, the vertically-integrated capacitor-AD structure comprising:
a first AD formed, at least in part, by patterned portions of the first patterned metal layer; and
a first metal-insulator-metal (MIM) capacitor formed in the metal layer system and at least partially overlapping with the first AD along a vertical axis orthogonal to the principal surface of the semiconductor substrate;
an input terminal; and
an output terminal spaced from the input terminal along a longitudinal axis parallel to the principal surface of the semiconductor substrate and perpendicular to the vertical axis, the first MIM capacitor and the first AD electrically coupled in parallel between the input terminal and the output terminal.

14. The integrated circuit of claim 13, wherein, as seen looking downwardly on the principal surface of the semiconductor substrate along the vertical axis, a straight line drawn between the input terminal and the output terminal transects the first MIM capacitor and the first AD.

15. A power amplifier integrated circuit, comprising:
a semiconductor substrate having an upper surface;
a metal layer system formed over the upper surface of the semiconductor substrate;
a power amplifier transistor further formed on the semiconductor substrate and electrically coupled to an input terminal;
a metal-insulator-metal (MIM) capacitor formed in the metal layer system and electrically coupled to a terminal of the power amplifier transistor; and
an avalanche diode (AD) further formed in the metal layer system, electrically coupled in parallel with the MIM capacitor, and located between the MIM capacitor and the semiconductor substrate taken along a vertical axis orthogonal to the upper surface of the semiconductor substrate.

16. The power amplifier integrated circuit of claim 15, wherein the AD comprises a plurality of contact fingers, which combine with the semiconductor substrate to form at least two diode elements arranged in a back-to-back configuration.

17. The power amplifier integrated circuit of claim 15, wherein the power amplifier transistor comprises a field effect transistor (FET) configured to amplify a radio frequency (RF) signal during operation of the power amplifier circuit; and
wherein the input terminal comprises a gate control terminal of the FET.

18. The power amplifier integrated circuit of claim 17, wherein the semiconductor substrate comprises a silicon-containing die; and
wherein the FET and the AD comprise a laterally-diffused metal oxide semiconductor transistor and an avalanche poly diode formed in the silicon-containing die, respectively.

19. The power amplifier integrated circuit of claim 15, wherein the MIM capacitor comprises an upper capacitor plate and a lower capacitor plate; and
wherein the metal layer system comprises:
a first metal layer in which the AD is formed;
outer metal layers in which the upper capacitor plate and the lower capacitor plate are formed, the outer metal layers located further from the semiconductor substrate than is the first metal layer; and
at least one intervening metal layer located between the first metal layer and the outer metal layer along the vertical axis.

* * * * *